United States Patent
Shim

(10) Patent No.: US 10,330,733 B2
(45) Date of Patent: Jun. 25, 2019

(54) APPARATUS FOR UPDATING CHARGING/DISCHARGING EFFICIENCY FACTOR OF ENERGY STORAGE SYSTEM

(71) Applicant: LSIS CO., LTD., Gyeonggi-do (KR)

(72) Inventor: Jae-Seong Shim, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 135 days.

(21) Appl. No.: 15/468,023

(22) Filed: Mar. 23, 2017

(65) Prior Publication Data

US 2018/0172774 A1 Jun. 21, 2018

(30) Foreign Application Priority Data

Dec. 19, 2016 (KR) .................. 10-2016-0173975

(51) Int. Cl.
G01R 31/36 (2019.01)
H02J 7/00 (2006.01)
(Continued)

(52) U.S. Cl.
CPC ......... *G01R 31/367* (2019.01); *G01R 31/385* (2019.01); *H02J 3/32* (2013.01);
(Continued)

(58) Field of Classification Search
CPC ... G01R 31/3151; G01R 31/3627; H02J 7/00; H02J 7/0077; H02J 7/04; H02J 7/045
See application file for complete search history.

(56) References Cited

U.S. PATENT DOCUMENTS

| 2014/0095088 A1* | 4/2014 | Kwok | G01R 31/3651 702/60 |
| 2015/0367834 A1* | 12/2015 | Runde | B60W 30/18127 701/22 |
| 2018/0054161 A1* | 2/2018 | Ramachandran | G06Q 30/0283 |

FOREIGN PATENT DOCUMENTS

| CA | 2157642 A1 | 3/1996 | |
| EP | 2933896 A1 * | 10/2015 | ................ H02J 3/32 |

(Continued)

OTHER PUBLICATIONS

European Search Reports dated Jul. 13, 2017 in connection with the counterpart European Patent Application No. 17162091.7.
(Continued)

*Primary Examiner* — Manuel L Barbee
(74) *Attorney, Agent, or Firm* — K&L Gates LLP

(57) ABSTRACT

Disclosed herein is an apparatus for updating charging/discharging efficiency factors of an energy storage system. The apparatus includes: a correlation coefficient calculate unit configured to calculate correlation coefficients between n charging/discharging reference values input to the energy storage system during a predetermined update cycle and (n+k) charging/discharging power values measured in the energy storage system after the predetermined update cycle has started, where n and k are natural numbers; a selection unit configured to select n charging/discharging power values corresponding to the n charging/discharging reference values among the (n+k) charging/discharging power values based on correlation coefficients; and an update unit configured to update the charging/discharging efficiency factors set for each power range with n charging/discharging efficiency factors calculated by using the n charging/discharging reference values and the selected n charging/discharging power values.

7 Claims, 4 Drawing Sheets

(51) Int. Cl.
*H02J 3/32* (2006.01)
*G01R 31/367* (2019.01)
*G01R 31/385* (2019.01)
*H02J 7/04* (2006.01)

(52) U.S. Cl.
CPC .............. *H02J 7/00* (2013.01); *H02J 7/0077* (2013.01); *H02J 7/045* (2013.01); *Y02B 40/90* (2013.01)

(56) References Cited

FOREIGN PATENT DOCUMENTS

| | | |
|---|---|---|
| EP | 2933896 A1 | 10/2015 |
| JP | H0620723 A | 1/1994 |
| JP | 2000012102 A | 1/2000 |
| JP | 2001339863 A | 12/2001 |
| JP | 2006-141093 A | 6/2006 |
| JP | 5042369 B2 | 10/2012 |
| JP | 2015215258 A | 12/2015 |
| KR | 10-2015-0078529 A | 7/2015 |
| KR | 10-2015-0121474 A | 10/2015 |

OTHER PUBLICATIONS

Japanese office action dated Sep. 5, 2017 for corresponding JP application.

\* cited by examiner

APPARATUS FOR UPDATING CHARGING/DISCHARGING EFFICIENCY FACTOR OF ENERGY STORAGE SYSTEM

CROSS-REFERENCE TO RELATED APPLICATIONS

This application claims the priority of Korean Patent Application No. 10-2016-0173975 filed on Dec. 19, 2016, in the Korean Intellectual Property Office, the disclosure of which is hereby incorporated by reference in its entirety.

BACKGROUND

1. Technical Field

The present disclosure relates to an apparatus for updating charging/discharging efficiency factors of an energy storage system, and more particularly, to an apparatus for updating charging/discharging efficiency factors of an energy storage system that updates, in real-time, charging/discharging efficiency factors for correcting charging/discharging reference values applied to the energy storage system.

2. Description of the Related Art

An Energy Storage System (ESS) stores generated power in linked systems including power plants, substations, transmission lines, etc. and then uses energy selectively and efficiently when necessary, to thereby increase the energy efficiency.

The ESS can reduce the deviations in electrical loads depending on time zones and seasons, thereby improving the overall load to lower the cost of generating electric power. Accordingly, the investment cost and operating cost required for expanding electric power facility can be reduced, such that electricity rates can be lowered and the energy can be saved.

Such ESSs are installed in power generation, transmission, distribution, and customers in power systems. They are used for frequency regulation, generator output stabilization using new and renewable energy, peak shaving, load leveling, emergency power, and so on.

ESSs are divided into physical energy storage and chemical energy storage depending on the storage manner. Physical energy storage includes method using pumped storage generation, compressed air storage, and flywheels. Chemical energy storage includes method using lithium ion batteries, lead acid batteries, and NaS batteries.

FIG. 1 is a flowchart for illustrating a process of charging/discharging electric power in a conventional ESS.

Referring to FIG. 1, for charging power to the ESS or outputting the power stored in the ESS, the power range including the target charging/discharging value required by the ESS is checked (step S1).

However, when the charging/discharging reference value equal to the target charging/discharging value required by the ESS is input from an external source to the ESS, a charging/discharging power different from the input charging/discharging reference value may be output or charged due to various conditions such as the operating environment of the ESS, deterioration of the secondary battery included in the ESS, power condition of the power system, etc.

To avoid this, the conventional ESS sets and stores the charging/discharging efficiency factors for correcting the charging/discharging reference values for each power range of the target charging/discharging values. Then, in the conventional ESS, the charging/discharging reference value is calculated using the charging/discharging efficiency factors of the power range including the target charging/discharging value determined in step S1 (step S2).

Subsequently, the conventional ESS charges electric power or outputs stored electric power based on the calculated charging/discharging reference value (step S3).

However, the conventional ESS uses the initially set charging/discharging efficiency factors without updating. Thus, there is a problem that an error is increased between the charging/discharging reference value and the electric power actually charged or discharged in the ESS as the operating environment changes such as deterioration of the secondary battery included in the ESS.

SUMMARY

It is an object of the present disclosure to provide an apparatus for updating charging/discharging efficiency factors of an energy storage system, which calculate correlation coefficients between n charging/discharging reference values input to the energy storage system during a predetermined update cycle and (n+k) charging/discharging power values measured in the energy storage system after the predetermined update cycle has started, where n and k are natural numbers, selects n charging/discharging power values corresponding to the n charging/discharging reference values among the (n+k) charging/discharging power values based on correlation coefficients, and updates the charging/discharging efficiency factors set for each power range with n charging/discharging efficiency factors calculated by using the n charging/discharging reference values and the selected n charging/discharging power values.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an apparatus for updating charging/discharging efficiency factors of an energy storage system includes: a correlation coefficient calculate unit configured to calculate correlation coefficients between n charging/discharging reference values input to the energy storage system during a predetermined update cycle and (n+k) charging/discharging power values measured in the energy storage system after the predetermined update cycle has started, where n and k are natural numbers; a selection unit configured to n charging/discharging power values corresponding to the n charging/discharging reference values among the (n+k) charging/discharging power values based on correlation coefficients; and an update unit configured to update the charging/discharging efficiency factors set for each power range with n charging/discharging efficiency factors calculated by using the n charging/discharging reference values and the selected n charging/discharging power values.

According to an exemplary embodiment of the present disclosure, charging/discharging efficiency factors of an energy storage system can be updated in real-time, by calculating correlation coefficients between n charging/discharging reference values input to the energy storage system during a predetermined update cycle and (n+k) charging/discharging power values measured in the energy storage system after the predetermined update cycle has started, where n and k are natural numbers, by selecting n charging/ discharging power values corresponding to the n charging/discharging reference values among the (n+k) charging/discharging power values based on correlation coefficients, and by updating the charging/discharging efficiency factors set for each power range with n charging/discharging efficiency factors calculated by using the n charging/discharging reference values and the selected n charging/discharging power values.

Also, it is possible to reduce the error between the charging/discharging reference values and the power actually charged or discharged in the ESS due to the change of the operating environment. In addition, the manager can check the charging/discharging efficiency factors accurately, and accordingly the energy storage system can be managed more efficiently.

DETAILED DESCRIPTION

Figure 1:
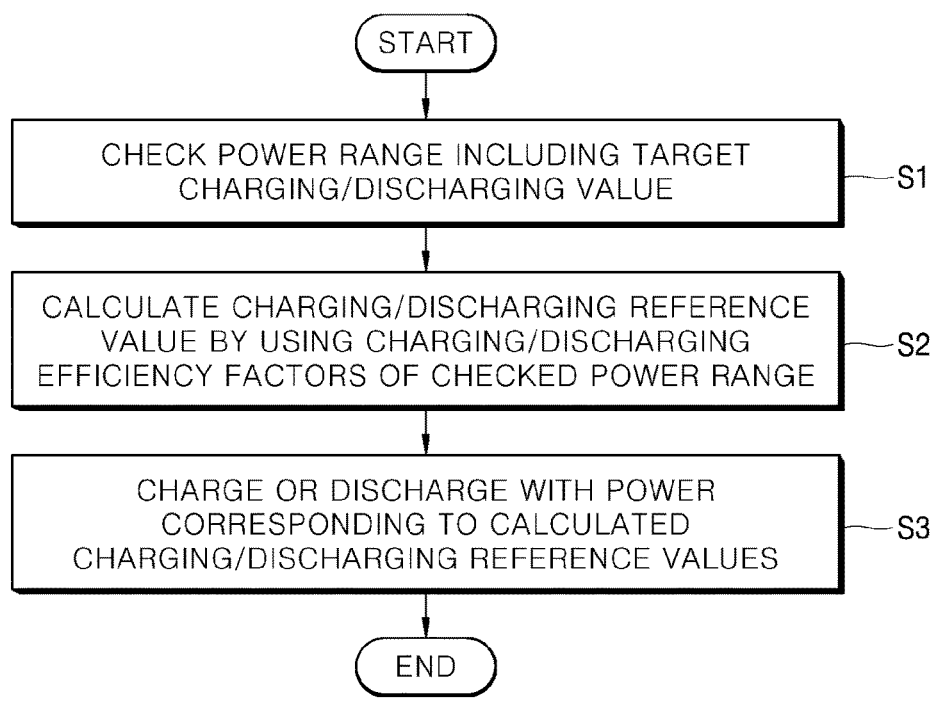
FIG. 1 is a flowchart for illustrating a process of charging/discharging electric power in a conventional ESS.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Figure 2:
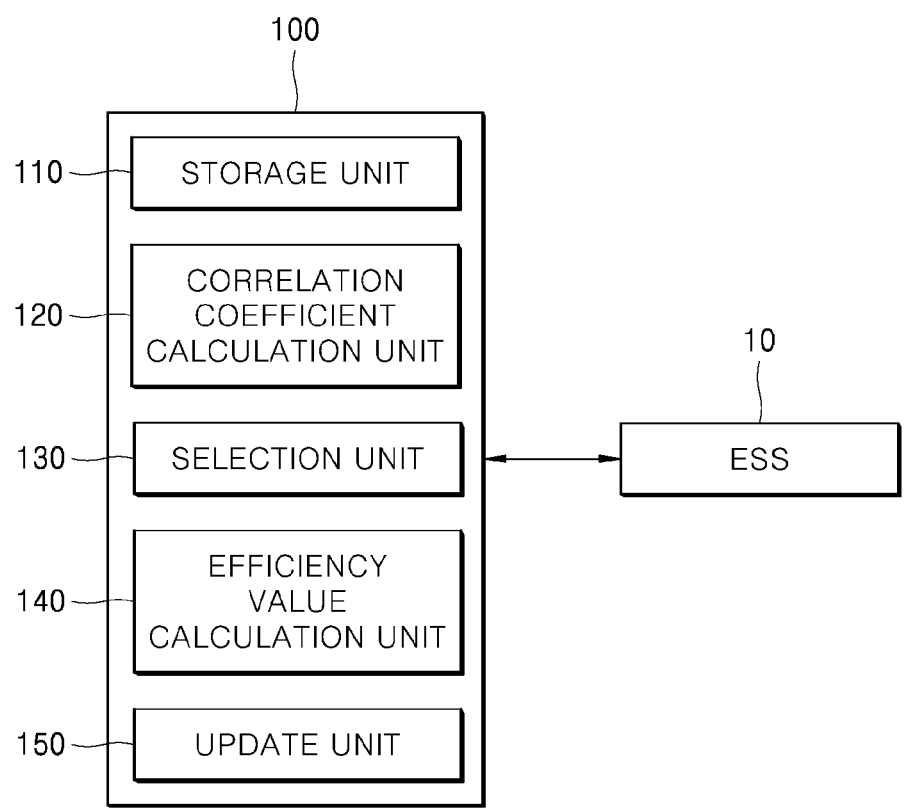
FIG. 2 is a block diagram illustrating a configuration of an apparatus for updating charging/discharging efficiency factors of an energy storage system according to an exemplary embodiment of the present disclosure in detail.

FIG. 2 is a block diagram illustrating a configuration of an apparatus 100 for updating charging/discharging efficiency factors of an energy storage system according to an exemplary embodiment of the present disclosure in detail.

Referring to FIG. 2, the apparatus 100 for updating charging/discharging efficiency factors of an energy storage system according to the exemplary embodiment of the present disclosure includes a storage unit 110, a correlation coefficient calculation unit 120, a selection unit 130, an efficiency factor calculation unit 140, and an update unit 150. The apparatus 100 shown in FIG. 2 is merely an exemplary embodiment of the present disclosure, and the elements are not limited to those shown in FIG. 2. Some elements may be added, modified or eliminated as desired.

Figure 3:
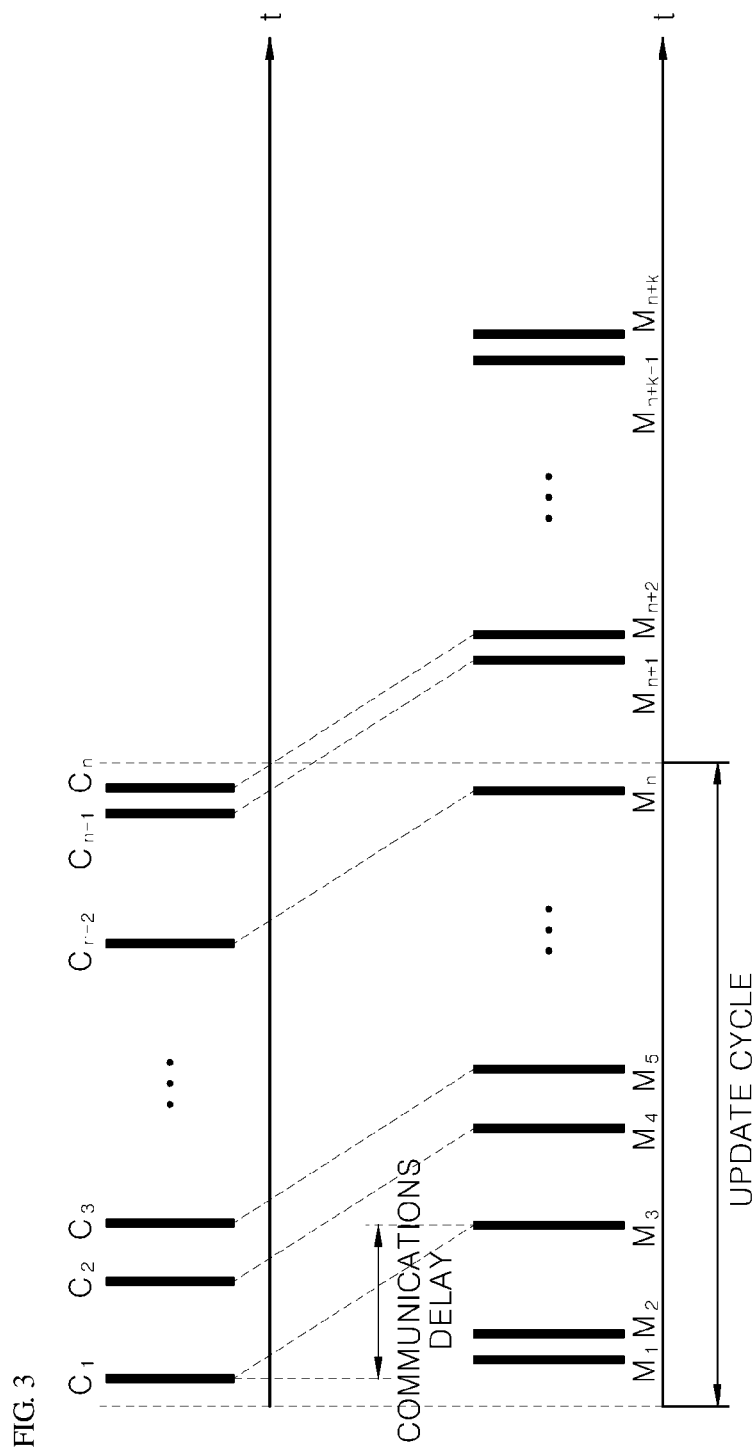
FIG. 3 is a diagram showing n charging/discharging reference values and (n+k) charging/discharging power values stored in a storage unit of an apparatus for updating charging/discharging efficiency factors of an energy storage system according to an exemplary embodiment of the present disclosure.

FIG. 3 is a diagram showing n charging/discharging reference values and (n+k) charging/discharging power values stored in the storage unit 110 of the apparatus for updating charging/discharging efficiency factors of the energy storage system according to the exemplary embodiment of the present disclosure.

Referring to FIG. 3, the storage unit 110 may store n charging/discharging reference values input to the ESS 10 during a predetermined update cycle, where n is a natural number.

As used herein, the charging/discharging reference values may be power values for setting the amount of power discharged from or charged in the ESS 10.

The number n of charging/discharging reference values stored in the storage unit 110 may vary depending on the operating environment of the ESS 10.

To this end, the apparatus 100 may receive charging/discharging reference values input to the ESS 10 from a control unit for controlling the charging/discharging of the ESS 10.

In addition, the storage unit 110 may store (n+k) charging/discharging power values measured in the ESS 10 after the predetermined update cycle has started, where k is a natural number.

As used herein, the charging/discharging power values may be actually measured amounts of power discharged from or charged in the ESS 10.

To this end, the apparatus 100 may receive charging/discharging power values from a power measuring unit for measuring the charging/discharging power of the ESS 10.

That is, the storage unit 110 may store the n charging/discharging reference values during the predetermined update cycle, as well as the charging/discharging power values stored after the predetermined update cycle has started until the number of stored charging/discharging power values becomes (n+k).

Accordingly, in the storage unit 110, the number of charging/discharging power values is larger than that of the charging/discharging reference values by k.

The number of the charging/discharging power values is larger than that of the charging/discharging reference values by k in the storage unit 100 because a charging/discharging power value corresponding to a charging/discharging reference value may be measured in the ESS 10 after a communications delay occurring when the charging/discharging reference value is input to the ESS 10.

Accordingly, as shown in FIG. 3, the charging/discharging power value corresponding to the first charging/discharging reference value C1 is not the first charging/discharging power value M1 but the third charging/discharging power value M3 measured after the communication delay time from the time point at which the first charging/discharging reference C1 is input.

For this reason, the storage unit 110 may store the (n+k) charging/discharging power values for the n charging/discharging reference values input to the ESS 10.

The correlation coefficient calculation unit 120 may calculate correlation coefficients between the n charging/discharging reference values and the (n+k) charging/discharging power values stored in the storage unit 110.

More specifically, the correlation coefficient calculation unit 120 may sort the (n+k) charging/discharging power values into groups each including n charging/discharging power values based on measured time points, and may calculate correlation coefficients between the n charging/discharging reference values and the n charging/discharging power values in each of the groups.

For example, when k is 2, the correlation coefficient calculation unit 120 may sort the (n+k) charging/discharging power values into groups including: a group of the first to $n^{th}$ charging/discharging power values, a group of the second to (n+1)$^{th}$ charging/discharging power values, and a group of the third to the (n+2)$^{th}$ charging/discharging power values.

Subsequently, the correlation coefficient calculation unit 120 may calculate the correlation coefficients between each of the first to n$^{th}$ charging/discharging power values, the second to the (n+1)$^{th}$ charging/discharging power values and the third to the (n+2)$^{th}$ charging/discharging power values, and the n charging/discharging reference values.

Accordingly, the correlation coefficient calculation unit 120 may calculate correlation coefficients between the first to the n$^{th}$ charging/discharging power values and the n charging/discharging reference values, correlation coefficients between the second to the (n+1) charging/discharging power values and the n charging/discharging reference values, and correlation coefficients between the third to the (n+2)$^{th}$ charging/discharging power values and the n the charging/discharging reference values.

TABLE 1

| Charging/discharging reference value | Charging/discharging power value | Correlation coefficient |
|---|---|---|
| First to n$^{th}$ | First to n$^{th}$ | $R_{CM,0}$ |
| First to n$^{th}$ | Second to (n + 1)$^{th}$ | $R_{CM,1}$ |
| First to n$^{th}$ | Third to (n + 2)$^{th}$ | $R_{CM,2}$ |

The correlation coefficient calculation unit 120 may calculate the correlation coefficients using Equation 1 below:

$$R_{CM,y} = \frac{\sum_{x=1}^{n}(C_x - A_{C,y})(M_{x+y} - A_{M,y})}{(n-1)S_{C,y}S_{M,y}} \quad \langle \text{Equation 1} \rangle$$

where $R_{CM,y}$ denotes correlation coefficient, $C_x$ denotes the charging/discharging reference value, $A_{C,y}$ denotes average value of charging/discharging reference values, $M_{x+y}$ denotes charging/discharging power value, $A_{M,y}$ denotes average value of the charging/discharging power values, $S_{C,y}$ denotes standard deviation of charging/discharging reference values, and $S_{M,y}$ denotes standard deviation of charging/discharging power values, where y ranges from 0 to k.

The selection unit 130 may select n charging/discharging power values corresponding to the n charging/discharging reference values among the (n+k) charging/discharging power values based on the correlation coefficients calculated from the correlation coefficient calculation unit 120.

More specifically, the selection unit 130 may select the group of the n charging/discharging power values with the largest correlation coefficient among the (n+k) charging/discharging power values.

When k is 1 as described above, the correlation coefficient calculation unit 120 may calculate the correlation coefficients between each of the first to n$^{th}$ charging/discharging power values, the second to the (n+1)$^{th}$ charging/discharging power values and the third to the (n+2)$^{th}$ charging/discharging power values, and the n charging/discharging reference values.

The selection unit 130 may compare correlation coefficients between the first to the n$^{th}$ charging/discharging power values and the n charging/discharging reference values, correlation coefficients between the second to the (n+1) charging/discharging power values and the n charging/discharging reference values, and correlation coefficients between the third to the (n+2)$^{th}$ charging/discharging power values and the n the charging/discharging reference values, and may select the largest correlation coefficient.

Then, if the correlation coefficient between the third to the (n+2)$^{th}$ charging/discharging power values and the n charging/discharging reference values is selected as the largest correlation coefficient, the selection unit 130 selects the third to the (n+2)$^{th}$ charging/discharging power values as the charging/discharging power values corresponding to n charging/discharging reference values.

In addition, the selection unit 130 may calculate a time difference between the time point of the earliest one of the charging/discharging power values among the n selected charging/discharging power values and time point of the earliest one of the charging/discharging reference values among the n charging/discharging reference values, as the communications delay time.

The efficiency factor calculation unit 140 may calculate the ratio between the n charging/discharging reference values and the n charging/discharging power values selected from the selection unit 130 as n charging/discharging efficiency factors.

For example, when the selection unit 130 selects the third to the (n+2)$^{th}$ charging/discharging power values among the (n+k) charging/discharging power values as ones corresponding to the n charging/discharging reference values, as shown in Table 2, the ratio between the n charging/discharging reference values and the third to the (n+2)$^{th}$ charging/discharging power values may be calculated as the n charging/discharging efficiency factors.

TABLE 2

| Charging/discharging reference value | Charging/discharging power value | Charging/discharging efficiency |
|---|---|---|
| First | Third | E1 |
| Second | Fourth | E2 |
| . . . | . . . | . . . |
| n$^{th}$ | (n + 2)$^{th}$ | En |

The efficiency factor calculation unit 140 may update the charging/discharging efficiency factors of the energy storage system using Equation 2 below:

$$E_n = \frac{M_n}{C_n} \quad \langle \text{Equation 2} \rangle$$

where En denotes charging/discharging efficiency factor, Mn denotes charging/discharging power value, and Cn denotes charging/discharging reference value.

The update unit 150 may update the charging/discharging efficiency factors set for each power range with the n charging/discharging efficiency factors calculated from the efficiency factor calculation unit 140.

Figure 4:
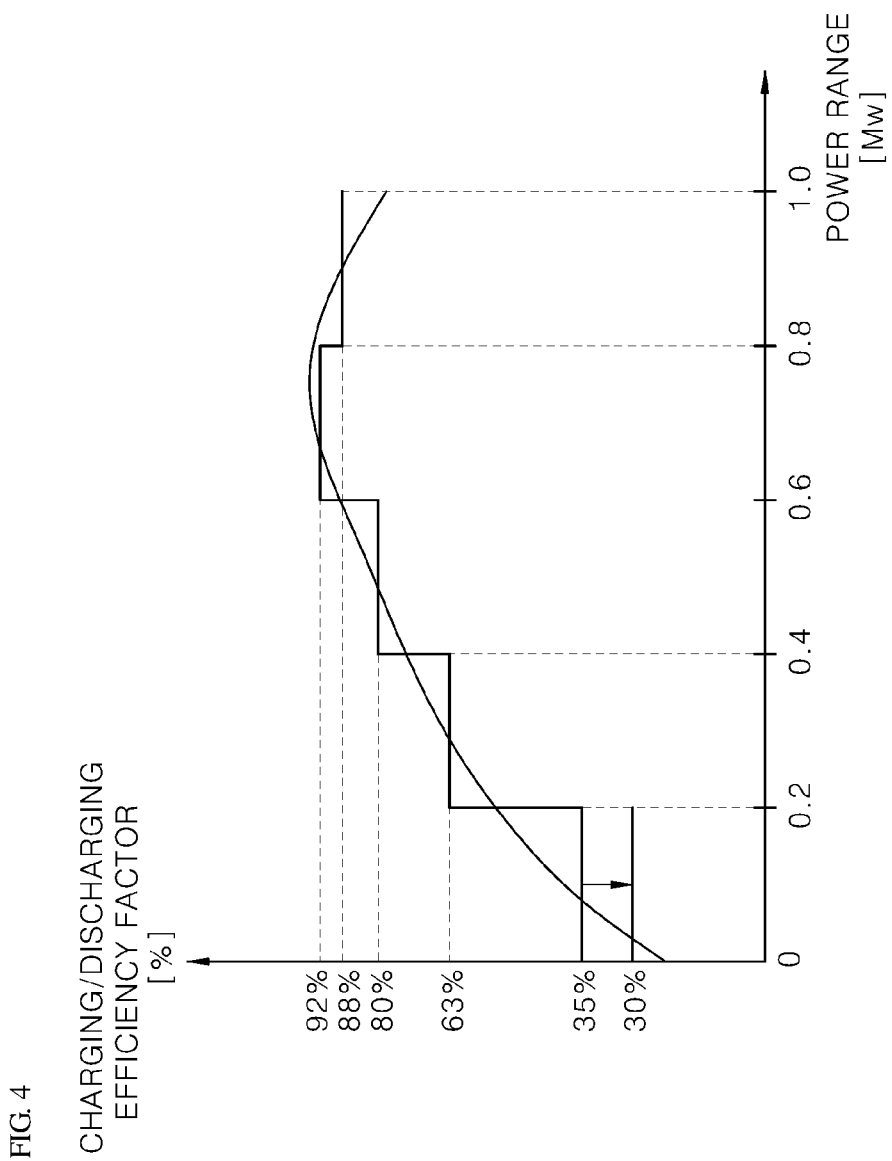
FIG. 4 is a graph showing charging/discharging efficiency factors for each power range updated by the apparatus for updating charging/discharging efficiency factors of an energy storage system according to an exemplary embodiment of the present disclosure.

For example, as shown in Table 3 and FIG. 4, when the storage unit 110 stores charging/discharging efficiency factors set every 0.2 MW, the update unit 150 may update the charging/discharging efficiency factors of the power range included the n charging/discharging reference values used for calculating the n charging/discharging efficiency factors with the charging/discharging efficiency factors calculated from the calculation unit 140.

For example, when the first charging/discharging reference value calculated from the efficiency factor calculation unit 140 is 30% and the first charging/discharging reference value used to calculate the first charging/discharging reference value is 0.15 MW, the update unit 150 may update the charging/discharging efficiency of 35% of the power range including the first charging/discharging reference value of 0.15 MW to 32%.

TABLE 3

| Power range | Charging/discharging efficiency factor |
| --- | --- |
| 0.0 to 0.2 MW | 35% |
| 0.2 to 0.4 MW | 63% |
| 0.4 to 0.6 MW | 80% |
| 0.6 to 0.8 MW | 92% |
| 0.8 to 1.0 MW | 88% |

Accordingly, the update unit 150 updates the predetermined charging/discharging efficiency factors with the charging/discharging efficiency factors calculated from the efficiency factor calculation unit 140 so that the power close to the target charging/discharging value required by the ESS is charged/discharged, thereby improving the accuracy of the charging/discharging reference values.

Also, it is possible to reduce the error between the charging/discharging reference values and the power actually charged or discharged in the ESS due to the change of the operating environment. In addition, the manager can check the charging/discharging efficiency factors accurately, and accordingly the energy storage system can be managed more efficiently.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:

1. An apparatus for updating charging/discharging efficiency factors of an energy storage system (ESS), the apparatus comprising:
    a correlation coefficient calculation unit configured to calculate correlation coefficients between n charging/discharging reference values input to the ESS during a predetermined update cycle and (n+k) charging/discharging power values measured in the ESS after the predetermined update cycle has started, where n and k are natural numbers;
    a selection unit configured to select n charging/discharging power values corresponding to the n charging/discharging reference values among the (n+k) charging/discharging power values based on the correlation coefficients; and
    an update unit configured to update the charging/discharging efficiency factors set for each power range with n charging/discharging efficiency factors calculated by using the n charging/discharging reference values and the selected n charging/discharging power values;
    wherein the correlation coefficients calculated by the correlation coefficient calculation unit is based on the n charging/discharging reference values, the n charging/discharging power values, a standard deviation of the n charging/discharging reference values, and a standard deviation of the charging/discharging power values.

2. The apparatus of claim 1, wherein the correlation coefficient calculation unit sorts the (n+k) charging/discharging power values into groups each including n charging/discharging power values based on measured time points, and calculates correlation coefficients between the n charging/discharging reference values and the n charging/discharging power values in each of the groups.

3. The apparatus of claim 1, wherein the correlation coefficient calculation unit calculates the correlation coefficients by using:

$$R_{CM,y} = \frac{\sum_{x=1}^{n}(C_x - A_{C,y})(M_{x+y} - A_{M,y})}{(n-1)S_{C,y}S_{M,y}}$$

where $R_{CM,y}$ denotes the correlation coefficient, $C_x$ denotes the charging/discharging reference value, $A_{C,y}$ denotes average value of the charging/discharging reference values, $M_{x+y}$ denotes the charging/discharging power value, $A_{M,y}$ denotes average value of the charging/discharging power values, $S_{C,y}$ denotes standard deviation of the charging/discharging reference values, and $S_{M,y}$ denotes standard deviation of the charging/discharging power values, where y ranges from 0 to k.

4. The apparatus of claim 1, wherein the selection unit selects n charging/discharging power values with a largest correlation coefficient from among the (n+k) charging/discharging power values.

5. The apparatus of claim 1, wherein the selection unit calculates a time difference between a time point of the earliest one of the n selected charging/discharging power values and a time point of the earliest one of the n charging/discharging reference values, as a communications delay time.

6. The apparatus of claim 1, further comprising: an efficiency factor calculation unit configured to calculate ratios between the n charging/discharging reference values and the n selected charging/discharging power values as the n charging/discharging efficiency factors.

7. The apparatus of claim 6, wherein the efficiency factor calculation unit calculates the n charging/discharging efficiency factors by using:

$$E_n = \frac{M_n}{C_n}$$

where $E_n$ denotes the charging/discharging efficiency factor, $M_n$ denotes the charging/discharging power value, and $C_n$ denotes the charging/discharging reference value.

* * * * *